United States Patent [19]

Engeler

[11] 4,139,783
[45] Feb. 13, 1979

[54] SINGLE PHASE SIGNAL PROCESSING SYSTEM UTILIZING CHARGE TRANSFER DEVICES

[75] Inventor: William E. Engeler, Scotia, N.Y.

[73] Assignee: General Electric Company, Schenectady, N.Y.

[21] Appl. No.: 769,200

[22] Filed: Feb. 16, 1977

Related U.S. Application Data

[63] Continuation of Ser. No. 609,416, Sep. 2, 1975, abandoned.

[51] Int. Cl.[2] ..................... G11C 19/28; H01L 29/78; H03H 7/28
[52] U.S. Cl. ................................ 307/221 D; 357/24; 333/70 T
[58] Field of Search ............. 357/24; 307/221 D, 304; 333/70 T

[56] References Cited

U.S. PATENT DOCUMENTS

| 3,801,883 | 4/1974 | Tiemann | 357/24 |
|---|---|---|---|
| 3,819,958 | 6/1974 | Gosney | 357/24 |
| 3,877,056 | 4/1975 | Bailey | 357/24 |
| 3,902,186 | 8/1975 | Engeler et al. | 357/24 |

OTHER PUBLICATIONS

Ibrahim et al., "CCD's for Transversal Filter Applications," Int. Electron Devices Meeting Tech. Digest, (12/74) pp. 240-243.
Melen et al., "One-Phase CCD: A New Approach to Charge-Coupled Device Clocking," IEEE J. Solid-State Circuits, vol. SC-7 (2/72), pp. 92-93.
Sangster "The 'Bucket-Brigade Delay Line' A Shift Register for Analogue Signals," Philips Tech. Review, vol. 31 (1970), pp. 92-110.
Buss et al., "Transversal Filtering Using Charge-Transfer Devices," IEEE J. Solid-State Circuits, vol. SC-8 (4/73), pp. 138-146.

Primary Examiner—William D. Larkins
Assistant Examiner—Gene M. Munson
Attorney, Agent, or Firm—Julius J. Zaskalicky; Joseph T. Cohen; Marvin Snyder

[57] ABSTRACT

In a charge transfer transversal filter a substrate of one conductivity type semiconductor material is provided. A first plurality of electrodes insulatingly overlie the substrate, each split into a first and a second part with a small gap therebetween. A second plurality of electrodes insulatingly overlie the substrate, each spaced between the adjacent electrodes of the first plurality. A first clock line is connected to the first parts of the first plurality of electrodes and a second clock line is connected to the second parts of the first plurality of electrodes. A fixed d-c voltage is applied to the first and second clock lines. A voltage pulsating above and below the fixed d-c voltage is applied to the second plurality of electrodes. Means are provided for introducing packets of charge representing sequential samples of an analog signal into the filter. Means are provided for deriving from the first and second lines an output which is representative of the difference in charge underlying the first and second parts of the first plurality of electrodes.

1 Claim, 6 Drawing Figures

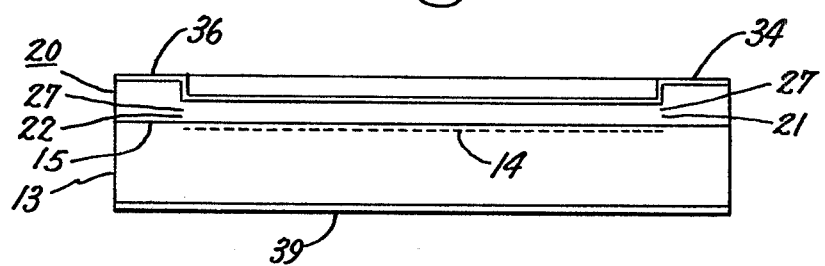
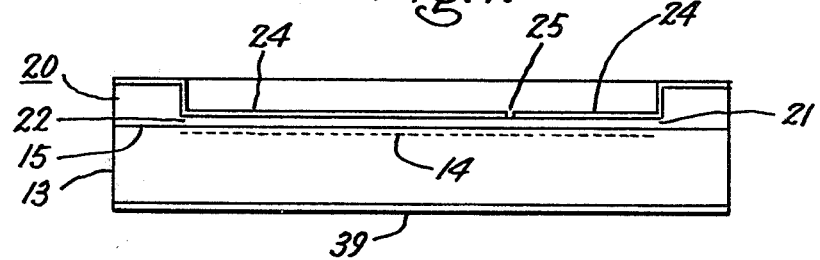

SINGLE PHASE SIGNAL PROCESSING SYSTEM UTILIZING CHARGE TRANSFER DEVICES

This is a continuation, of application Ser. No. 609,416, filed Sept. 2, 1975, now abandoned.

The present invention relates to signal processing systems utilizing charge transfer devices and in particular to improvements in transversal filters utilizing split electrode charge transfer devices.

A charge transfer transversal filter comprises a serial organization of N stages of closely coupled MOS (Metal-Oxide-Semiconductor) capacitors. Charge packets representing sequential samples of an analog signal are serially inserted into the filter and are clocked at a rate $f_c = 1/T_c$ per sec, where $T_c$ is the period of the sampling, along the N stages of the filter. A charge packet emerges from the last stage $NT_c$ seconds after introduction or insertion into the filter. The filter includes means for nondestructively measuring and weighting the signal samples at each of the stages. The measuring and weighting of the signal samples simultaneously in all stages is achieved by setting the value of the capacitors on which the signal samples are stored according to the desired tap weights. Tap weights are implemented in each of the stages by splitting the commonly phased electrodes of the capacitors of the stages into an A side or part and a B side or part. The A sides of the electrodes are connected together and to a first commonly phased line, and also the B sides of the electrodes are connected together and to a second commonly phased line. An electrode with a split at the center corresponds to a tap weight of zero. An electrode split such that the active portion of the electrode is connected to only the first commonly phase line corresponds to a tap weight of −1. An electrode split such that the active portion of the electrode is connected to only the second commonly phased line corresponds to a tap weight of +1. An electrode split at an intermediate point would provide a corresponding intermediate tap weight.

With such a means for providing tap weights in order to obtain a sum of the weighted samples, the negatively weighted samples are summed on the first line and the positively weighted samples are summed on the second line. A differential amplifier connected to the first and second lines is utilized to obtain the net sum. Thus, a surface charge transversal filter, such as described above, generates an output signal $S_{out}(t)$ which is the convolution of N samples of an input signal $S_{in}(t)$ with a set of N weighting factors ($W_n$) referred to as tap weights. The foregoing statement may be expressed mathematically as follows:

$$S_{out}(t) = \sum_{n=1}^{N} W_n S_{in}(t-nT_c). \quad (1)$$

The filter response is determined entirely by the choice of the set of N tap weights $W_n(n = 1,N)$. If a particular response is desired, it may be approximated by choosing the N tap weights appropriately.

The present invention is particularly directed to the provision of a charge transfer transversal filter utilizing charge transfer devices with split electrodes which is simple in organization and effective in operation.

Another object of the present invention is to provide improvements in signal processing systems utilizing charge transfer devices.

In carrying out the present invention in one form in a shift register, there is provided a substrate of semiconductor material of one conductivity type. A first plurality of electrodes insulatingly overlying the substrate, each split into a first and a second part with a gap therebetween, is provided. A second plurality of electrodes insulatingly overlying the substrate, each spaced between adjacent electrodes of the first plurality, is provided. Means are provided for connecting the first parts of the electrodes of the first plurality to a first clock line. Means are provided for connecting the second parts of the electrodes of the first plurality to a second clock line. Means are provided for applying a fixed d-c voltage to the first and second clock lines to form a first plurality of storage regions in the substrate having first value of surface potential when empty of stored charge, each of the storage regions underlying a respective electrode of the first plurality. Means are provided for applying a pulsating voltage to the electrodes of the second plurality to form a second plurality of storage regions in the substrate having values of surface potential when empty greater than and less than the first value in correspondence to the extreme values of the pulsating voltage. A plurality of transfer electrodes are provided, each insulatingly overlying a respective adjacent pair of electrodes of the first and second pluralities. Means are provided for applying a fixed voltage to one group of alternate transfer electrodes and a pulsating voltage synchronized with the first pulsating voltage to the other group of alternate transfer electrodes to restrict transfer of charge introduced into the shift register from one plurality of storage regions to the other plurality of storage regions in one direction from one end to the other end of the shift register in step with the pulsating voltage.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 3 is a sectional view of the apparatus of FIGS. 1 and 2 taken along sectional lines 3—3 of FIG. 2.

FIG. 4 is a sectional view of the apparatus of FIGS. 1 and 2 taken along sectional lines 4—4 of FIG. 2.

Figure 1:
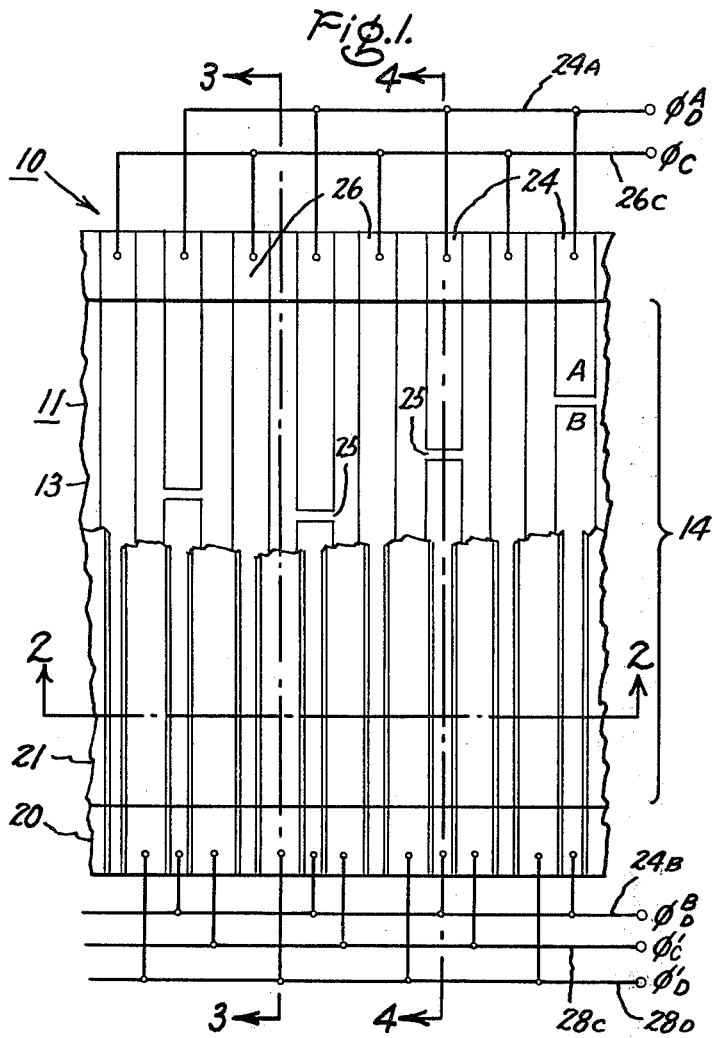
FIG. 1 shows a plan view of a charge transfer device with split electrodes connected to provide transversal filtering.

Reference is now made to FIGS. 1 through 4 which show a portion of a transversal filter 10 including a charge coupled shift register 11 in accordance with the present invention. The shift register 11 is formed on a substrate 13 of N-type conductivity silicon semiconductor material which has a channel portion 14 of uniform width adjacent a major surface 15 of the substrate. Overlying the major surface of the substrate 13 is a thick insulating member 20 of silicon dioxide having a thin portion 21 of generally rectangular outline and lying in registry with the channel portion 14 of the substrate. A first plurality of electrodes 24 are provided on the insulating member 20 overlying the thin portion 21 thereof and orthogonal to the length thereof. Each of the electrodes 24 is of uniform length in the direction of the length of the semiconductor channel portion 14 and each of the electrodes 24 extends across the thin insulating portion 21 of the insulating member as well as over the bordering thick insulating portions of the insulating member 20. Each of the electrodes 24 of the first plurality has a split or gap 25 across the short dimension thereof over the first channel portion which divides the electrode into a first or A part and a second or B part.

The gap or split 25 in each of the electrodes 24 is small to allow the depletion regions or potential wells under the A and B parts to be coupled together efficiently to enable charge transferred to two potential wells under each electrode 24 to equilibrate, i.e. the charge density under the A and B parts of the electrode is identical. Preferably, regions of P-type conductivity are provided underlying each of the gaps 25 to enable the conduction of charge between adjacent potential wells of a split electrode 24 of the shift register, as is more fully described and claimed in a copending application Ser. No. 609,414 filed Sept. 2, 1975, now U.S. Pat. No. 4,005,377, and assigned to the assignee of the present invention. The aforementioned application is incorporated herein by reference thereto.

A second plurality of electrodes 26 which are unsplit are provided on the insulating member 20 overlying the thin portion 21 thereof and orthogonal to the length thereof. Each of the electrodes 26 is of uniform length in the direction of the length of the channel portion 14 and equal to the uniform length of each of the electrodes 24 of the first plurality. Each of the electrodes 26 of the second plurality are spaced between adjacent electrodes 24 of the first plurality and each extends completely over the thin insulating portion of the insulating member 20 as well as the bordering thick insulation portions of the insulating member 20. An insulating layer 27 is provided over the electrodes 24 and 26 of the first and second plurality. A plurality of transfer electrodes 28 are provided over the insulating layer 27, each of the transfer electrodes being insulatingly spaced between adjacent electrodes of the first and second pluralities and overlying the adjacent members thereof. Each of the transfer electrodes 28 is of substantially uniform extent in the direction of the length of the channel portion 14 and each electrode 28 extends entirely over the thin insulating portion 21 of the insulating member 20 as well as the bordering thick insulating portions thereof.

Figure 5:
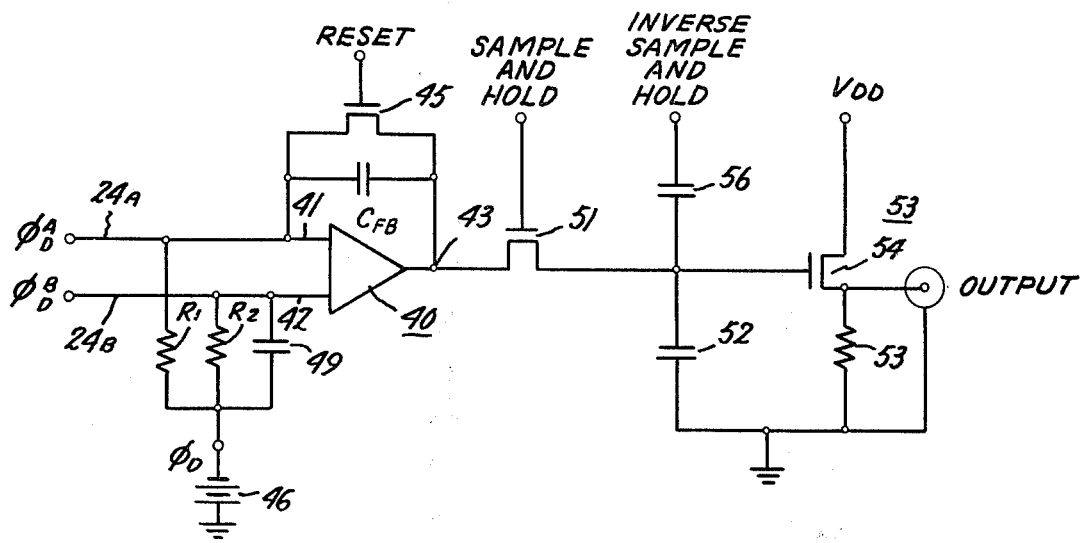
FIG. 5 is a schematic diagram of differential sensing circuit utilized with the device of FIG. 1 to provide transversal filtering.
Figure 6:
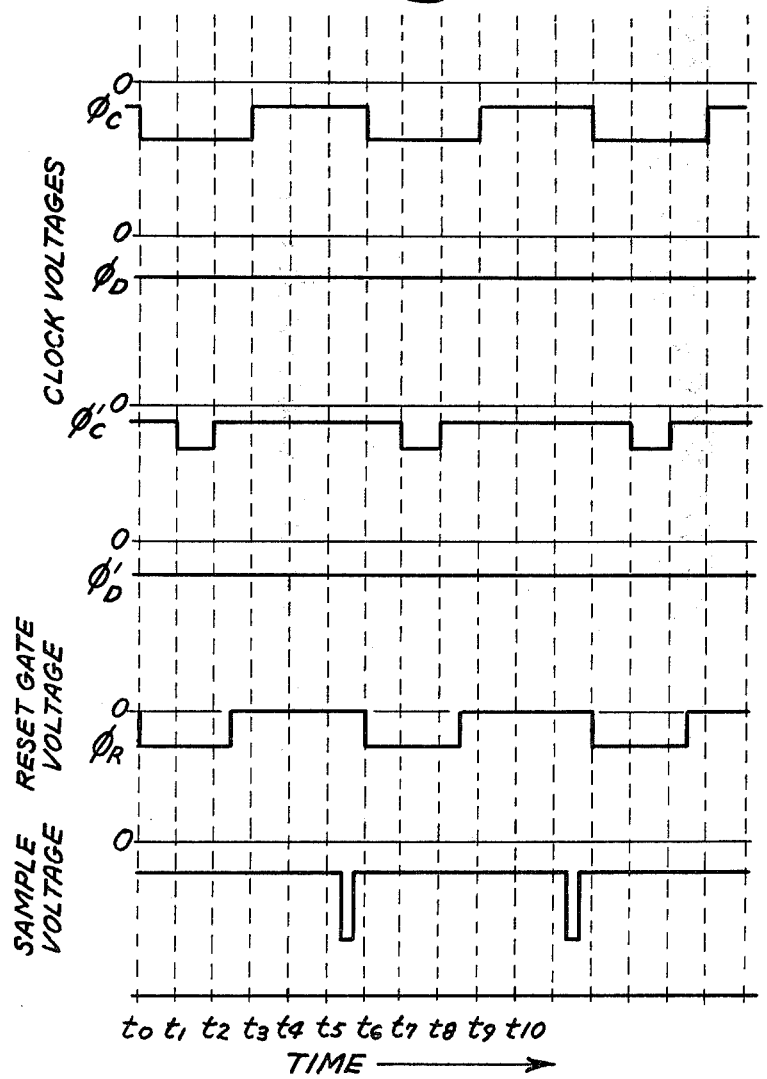
FIG. 6 is a diagram of voltage waveforms useful in explaining the operation of the transversal filtering apparatus of FIGS. 1 and 5.

All of the A or first parts of the electrodes 24 of the first plurality are connected to a common line 24A to which a $\phi_D$ voltage, $\phi_D{}^A$, is applied through the circuit of FIG. 5. All of the B or second parts of the electrodes 24 of the first plurality are connected to a common line 24B to which a $\phi_D$ voltage, designated voltage $\phi_D{}^B$, is applied through the circuit of FIG. 5. The manner of application of the $\phi_D$ voltage will be explained in connection with FIG. 5. All of the second plurality of electrodes 26 are connected to a common line 26C to which a voltage $\phi_C$ is applied which is shown in FIG. 6. All of the transfer electrodes 28 immediately preceding the split electrodes 24, that is on the input side thereof, are connected to a common line 28D. All of the transfer electrodes 28 located on the output side of the conductor members of the first plurality are connected to a common line 28C. A conductive layer 39 of a suitable material such as aluminum is bonded to the lower surface of the substrate 13 to provide a ground connection for the filter.

Figure 2:
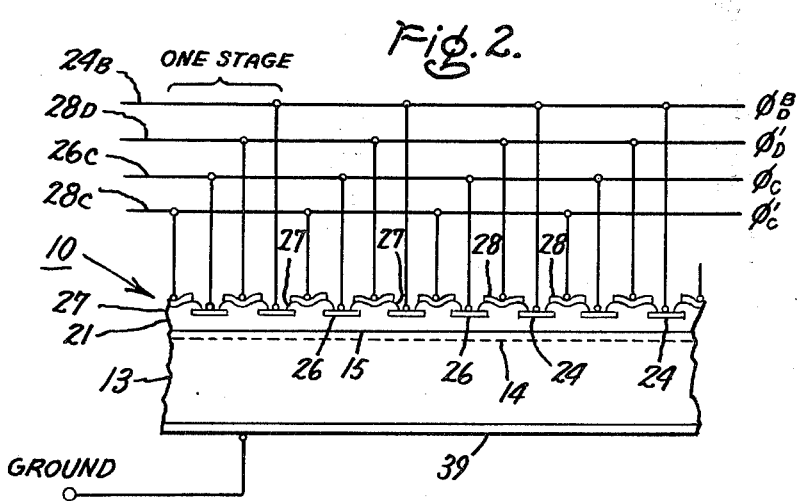
FIG. 2 is a sectional view of FIG. 1 taken along sectional lines 2—2 of FIG. 1.

The portion of the transversal filter 10 shown in FIGS. 1 and 2 and described above is a portion of main shift register of the transversal filter described and claimed in patent application Ser. No. 609,415 filed Sept. 2, 1975, now U.S. Pat. No. 4,032,867, and assigned to the assignee of the present invention. The aforementioned U.S. Pat. No. 4,032,867 is incorporated herein by reference thereto. The manner in which packets of charge varying in accordance with an analog signal are serially applied to the input of the shift register 11, the manner in which the charge packets are clocked along the shift register and the manner in which charge is collected by a drain at the output of the shift register is described in the aforementioned U.S. Pat. No. 4,032,867.

The manner in which packets of charge are transferred from stage to stage along the shift register of FIGS. 1 and 2 and the manner in which charge is sensed during such transfer will be described in connection with the output circuit of FIG. 5. The output circuit of FIG. 5 is identical to the output circuit of FIG. 9 of the aforementioned U.S. Pat. No. 4,032,867. The manner in which the stages of shift register are weighted has been described above and is more fully described in the aforementioned U.S. Pat. No. 4,032,867. It has also been pointed out above that the difference between the charge induced on the lines 24A and 24B represents the convolution of the samples of an analog input signal with the weighting factors of the various stages of the transversal filter as set forth in equation 1 above. To this end there is provided a high gain differential amplifier 40 having an inverting input terminal 41, a non-inverting input terminal 42 and an output terminal 43. The differential amplifier may be any of a variety of operational amplifiers commercially available, for example, operational amplifier LM318 available from National Semiconductor Company of Santa Clara, California. The inverting input terminal 41 is connected to first line 24A interconnecting the A parts of the $\phi_D$ electrodes 24 of FIG. 1. The output terminal 43 is connected to the inverting input terminal 41 through a feedback capacitance $C_{FB}$. The potential of the inverting terminal 41 of the high gain differential amplifier with capacitance feedback follows the potential of the non-inverting terminal 42 and delivers a voltage at the output terminal 43 which is proportional to the difference in induced charge on the input line 24A divided by the feedback capacitance $C_{FB}$. A reset switch 45 in the form of a MOSFET transistor is connected across the feedback capacitor $C_{FB}$. A source 46 of fixed voltage having its positive terminal connected to ground provides $\phi_D$ voltage. A first resistor $R_1$ connected between the negative terminal of source 46 of $\phi_D$ voltage and the first line 24A provides a resetting and isolation function with respect to the first line and the electrodes connected thereto. A second resistor $R_2$ connected between the negative terminal of the source 46 of $\phi_D$ voltage and the second line 24B provides a resetting and isolation function with respect to the second line 24B. A capacitor 49 is connected between the non-inverting terminal 42 and the negative terminal of source 46. The capacitance 49 is equal to the capacitance of feedback capacitor $C_{FB}$ and is provided to maintain balance of capacitances on the two lines 24A to 24B to assure proper operation of the differential sensing circuit. It is assumed that the capacitances of lines 24A and 24B are substantially equal. If they are not, balance of the lines may be provided by use of the parallel shift register described in the aforementioned U.S. Pat. No. 4,032,867. It should be noted that output terminal 43 has a relatively low impedance with respective to ground and is essentially at A-C ground. Accordingly, as the total capacitance on the first line 24A is equal to the total capacitance on the second line 24B, and the resistance $R_1$ and $R_2$ are equal, the time constants of the lines 24A and 24B are equal.

A sampling circuit is connected between output terminal 43 and ground, and comprises a MOSFET transistor 51 connected in series with a sampling capacitor 52. The source to drain conduction path of the MOSFET transistor 51 is connected in series with the sampling capacitor 52. The gate electrode of the MOSFET transistor 51 is connected to a source of sampling pulses, such as shown in FIG. 6. The output appearing across the sampling capacitor 52 is applied to a source follower circuit 53 which includes a MOSFET transistor 54, the source to drain conduction path of which is connected in series between a source of operating potential $V_{DD}$ and ground through an output impedance 55. The sampling capacitor 52 is connected between the gate of transistor 54 and ground. A voltage waveform which is the inverse of the sample voltage waveform of FIG. 6 is applied to sampling capacitor 52 through coupling capacitor 56 to cancel feed through of the sample pulses applied to transistor 51.

The manner in which the circuit of FIG. 5 connected to the transversal filter of FIG. 1 derives an output which is a measure of the difference in charges induced on the A parts of electrodes 24 connected to line 24A and the B parts of electrodes 24 connected to line 24B in response to the transfer of charge to the storage regions lying thereunder will now be explained in connection with the waveform diagrams of FIG. 6. The $\phi_C$, $\phi_C'$ and $\phi_D'$ voltages are applied, respectively, to lines 26C, 28C and 28D from suitable sources (not shown). The voltage $\phi_D$ is applied to the lines 24A and 24B from a source 46. Packets of charge representing signal samples are introduced at the input of the transversal filter 10 and are clocked along the semiconductor surface from stage to stage of the filter as fully explained in the aforementioned patent 4,032,867. The manner in which charges are clocked along will now be briefly described in connection with FIGS. 1, 2 and 6. Typically, for an oxide thickness under the $\phi_C$ and $\phi_D$ electrodes 24 and 26 of about 1000 Angstrom Units and an oxide thickness under the $\phi_C'$ and $\phi_D'$ electrodes of about 2000 Angstrom Units, the voltage levels of the $\phi_C$ waveform are −6 and −28 volts, and the voltage levels of the $\phi_C'$ waveform are −3 and −22 volts. The voltage level of $\phi_D$ and $\phi_D'$ are, respectively, −15 and −9 volts. During the interval $t_o$-$t_1$ with the transfer gate voltage $\phi_C'$ at its least negative value, no charge is transferred from the storage sites underlying the $\phi_D$ electrodes to the storage sites underlying the $\phi_C$ electrodes. During the interval $t_1$-$t_2$ with the $\phi_C$ voltage and the transfer gate voltage $\phi_C'$ at their most negative values, charge is transferred from the storage sites underlying the $\phi_D$ electrodes to the storage sites underlying the $\phi_C$ electrodes. At a point in time between $t_3$ and $t_4$ the voltage applied to the $\phi_C$ and the $\phi_C'$ clock lines has decreased. Thus, the surface potentials of the storage regions underlying the $\phi_C$ electrodes 26 have been raised to a value above the surface potentials underlying $\phi_D$ electrodes 24 which are maintained at a constant value.

Also, the surface potentials of the substrate underlying the $\phi_C'$ electrodes have been raised to a value above the surface potential of the substrate underlying the $\phi_D'$ electrodes which are maintained at a constant value. Accordingly, the charge in the potential well underlying the $\phi_C$ electrodes flows into the potential well underlying the $\phi_D$ electrodes. In order to assure transfer of charge in the potential wells underlying the $\phi_C$ electrodes to the potential wells underlying the $\phi_D$ electrodes, the voltage $\phi_C'$ is raised a short time earlier than the time of the rise in the $\phi_C$ voltage thereby establishing a barrier to the flow of charge in a direction opposite to the desired direction, i.e., the desired direction being from left to right in FIGS. 1 and 2.

Continuing with the explanation of the operation of the circuit of FIG. 5, the reset switch 45 is closed from a time $t_o$ to a time somewhat after $t_2$, as seen from the reset waveform $\phi_R$ of FIG. 6 applied to the gate of transistor 45, and shorts out the feedback capacitor $C_{FB}$. During this interval the potential at the input terminal 41 is set equal to the potential on the output terminal 43 and the potential on input terminal 42. The potential on terminals 41, 42 and 43 of the differential amplifier would be essentially the potential of the $\phi_D$ source 46 assuming induced charge on line 24B has decayed to zero. At instant $t_3$, the $\phi_C$ voltage goes to its least negative value and thereby enables charge to be transferred from $\phi_C$ storage sites to the $\phi_D$ storage sites. The reset switch 45 is opened somewhat before $t_3$, as the reset voltage $\phi_R$ goes to zero at that time. Charge transfer from the $\phi_C$ to the $\phi_D$ storage sites occurs during the interval $t_3$-$t_6$. When surface charge transfers from the $\phi_C$ to the $\phi_D$ sites, an opposing charge which is proportional to the transferred charge is induced in the $\phi_D$ lines 24A and 24B. As the capacitance of line 24A is the same as the capacitance of line 24B and as the lines are isolated from source 46 by resistors $R_1$ and $R_2$, respectively, the charge transfer induces a voltage change on the lines proportional to the individual charges induced thereon. The interval of transfer of charge, i.e. $t_3$-$t_6$, is relatively short in comparison to the time constant of the total capacitance of the line 24A and resistance $R_1$ and in comparison to the time constant of the total capacitance of the line 24B and resistance $R_2$. As the high gain differential amplifier has capacitance feedback to the inverting terminal, the inverting input terminal 41 follows the potential of the non-inverting terminal 42. Thus a difference in induced charge on the first and second lines causes the amplifier to deliver charge from the output terminal to the inverting input terminal through the feedback capacitance to maintain equal voltage on the input terminals. Accordingly the difference in charge induced on the lines is represented by the change in voltage at the output terminal ($\Delta e_o$) times the feedback capacitance $C_{FB}$. With a differential amplifier with a fast slew rate, the new level of output voltage is reached rapidly. With the time constants associated with lines 24A and 24B relatively long with respect to the charge transfer time, the amplifier can quickly develop an output which is a measure of the difference in induced charge on the lines. Sampling the change in output level of voltage provides a measure of the sum of the weighted samples of the analog signal. The output voltage is sampled after the charge transfer has been completed and during the interval $t_5$-$t_6$ by energizing the MOSFET transistor 51 to charge the sampling capacitor 52 and thereby obtain a sample voltage which is a measure of the difference in charge delivered to the lines 24A and 24B. The sampled voltage is applied to the gate of the source follower 53 from which the output is obtained. As some of the sample pulse applied to the gate of transistor 51 may feed through to the source follower, the inverse of the sample pulse voltage is applied to the gate of the source follower 53 to cancel such feedthrough. After the transfer of charge from the $\phi_C$ storage sites to the $\phi_D$ storage sites, the voltages on the $\phi_D$ lines 24A and 24B due both to the transfer of charge and to the clock voltage fed through the interelectrode capacitances of the $\phi_C'$ electrodes with respect to $\phi_D$ electrodes, decay through the resistances $R_1$ and $R_2$. Each of the above voltages may be several volts. Note that the difference in voltage on the lines 24A and 24B upon the transfer of charge into the $\phi_D$ electrodes is measured in the order of tenths of a volt. Preferably, the time constant of resistance $R_1$ times the capacitance of the line 24A and also the time of constant of resistance $R_2$ times the capacitance of the line 24B are short in relation to the period of the clocking frequency, to assure resetting of the lines 24A and 24B to the $\phi_D$ voltage prior to transfer of another set of analog signal samples to the storage sites underlying the $\phi_D$ electrodes. However, this time constant should not be so short as to be comparable to the charge transfer interval and hence affect obtaining an accurate measure of the difference in charge induced on lines 24A and 24B. For accurate operation of the differential read out circuit the time constant of the capacitance of line 24A and resistance $R_1$ should be equal to the time constant of the capacitance of line 24B and resistance $R_1$. Actuation of the reset switch 45 at time $t_6$ after sampling has been accomplished causes the potential of terminal 41 to be fixed to the potential of the non-inverting terminal 42 by feedback action through the direct connection from the output terminal 43 to the inverting input 42 and also causes the feedback capacitance $C_{FB}$ to be completely discharged and readied for another sensing operation. Thus, in response to transfer of charge from the $\phi_C$ electrodes to the $\phi_D$ electrodes, the circuit responds at a fast rate to provide a change in level of output at terminal 43 which is an accurate measure of the difference in charge induced on the lines 24A and 24B and thereafter the voltages on the lines 24A and 24B decay at a relatively slow rate to the voltage $\phi_D$ of source 46 before the next cycle of transfer of charge from the sites underlying the $\phi_C$ electrodes to the sites underlying the $\phi_D$ electrodes.

As the $\phi_D$ electrodes connected to lines 24A and 24B are capacitively coupled to the $\phi_C'$ electrodes, clocking voltage on the $\phi_C'$ electrodes feeds through to the lines 24A and 24B. The differential amplifier 40 rejects this common mode signal. As the signal varies, both the inverting terminal 41 and non-inverting terminal 42 vary by the same amount and in the same direction when the coupling capacitances to the lines 24A and 24B are identical.

The differential readout circuit of FIG. 5 is described and claimed, including modifications, in a copending application Ser. No. 609,497 filed Sept. 2, 1975, now U.S. Pat. No. 4,004,157, and assigned to the assignee of the present invention. The aforementioned U.S. Pat. No. 4,004,157 is incorporated herein by reference thereto. Other different readout circuits suitable for providing readout in the filter of the present invention are described and claimed in copending application Ser. No. 609,496 also filed Sept. 2, 1975 and assigned to the assignee of the present invention. The aforementioned application Ser. No. 609,496 is incorporated herein by reference thereto.

It is apparent that whereas the filter has been described in terms of a "p-channel" device, i.e., a device in which the stored charge is in the form of positive charge carriers or "holes", an "n-channel" device may be similarly constructed by methods well known to those skilled in the art. In the "n-channel" device the stored and transferred charge is in the form of negatively charged carrier or electrons. This necessitates operation of the device with potential of the opposite sign.

While it has been shown that it is possible to utilize in charge transfer transversal filters an output structure consisting of a pair of common overlying electrodes maintained at a relatively fixed potential while still utilizing these electrodes to provide charge transfer functions, it is also possible to provide the advantages of this structure in a non-serial charge transfer device such as in the correlator devices disclosed in U.S. Pat. No. 3,801,883, assigned to the assignee of the present invention. The aforementioned patent is incorporated herein by reference thereto. In either instance both output electrodes and the output circuitry connected thereto are maintained at a relatively fixed d-c potential. Thus, the common mode problems encountered when clocking electrodes are employed for read out are avoided. In the case of the correlator apparatus of FIG. 4 of aforementioned U.S. Pat. No. 3,801,883, the lines $\phi_1(A)$ and $\phi_1(B)$ would be connected respectively to lines 24A and 24B of the circuit of FIG. 5 of this patent application and of course a pulsating voltage would be applied to $\phi_2$ line. Thus, the lines $\phi_1(A)$ and $\phi_1(B)$ are maintained at a relatively fixed potential and output is obtained therefrom.

While the invention has been described in specific embodiments, it will be appreciated that modifications, such as those described above, may be made by those skilled in the art and it is intended by the appended claims to cover all such modifications and changes as fall within the true spirit and scope of the invention.

I claim as my invention:
1. Charge transfer apparatus comprising
   a substrate of semiconductor material of one conductivity type,
   a first plurality of electrodes insulatingly overlying said substrate, each split into a first and a second part with a separation therebetween,
   a second plurality of electrodes insulatingly overlying said substrate, each spaced adjacent said first and second parts of a respective electrode of said first plurality,
   means for connecting the first part of said electrodes of said first plurality to a first clock line,
   means for connecting the second parts of said electrodes of said first plurality to a second clock line,
   means for coupling a first fixed voltage to said first and second clock lines to form a first plurality of storage regions in said substrate, said coupling means maintaining said clock lines at a substantially fixed potential,
   means for applying a first pulsating voltage to said electrodes of said second plurality to form a second plurality of storage regions in said substrate and to effect the transfer of charge from storage region to storage region of said first and said second plurality of storage regions, a plurality of transfer electrodes, each insulatingly overlying a respective adjacent pair of electrodes of said first plurality and said second plurality of electrodes, alternate ones of said transfer electrodes being interconnected to form a first plurality and a second plurality of transfer electrodes, means for applying a second fixed voltage to said first plurality of transfer electrodes, means for applying a second pulsating voltage to said second plurality of transfer electrodes, means for synchronizing said first and second pulsating voltages, said second fixed voltage being of a value in relation to said first fixed value of voltage and the levels of said second pulsating voltage to permit transfer of charge in one direction from said second plurality of storage regions to said first plurality of storage regions, and the levels of said second pulsating voltage being set in relation to the levels of said first pulsating voltage to permit transfer of charge in said one direction from storage regions of said first plurality to storage regions of said second plurality under the control of the level of potential on said second plurality of transfer electrodes, the time of transition in level of said second pulsating voltage in a cycle thereof from a level which permits the transfer of charge from said first plurality of storage regions to said second plurality of storage regions to a level which inhibits such transfer being set to occur prior to the time of transition in level of said first pulsating voltage in a cycle thereof from a level enabling said second plurality of storage regions to receive charge from said first plurality of storage regions to a level enabling said second plurality of storage regions to transfer charge to said first plurality of storage regions, output means connected to said first and second parts of the electrodes of said first plurality, means for rendering said output means operative to sense the transfer of charge from said second storage regions to said first storage regions at a time subsequent to said level transition time of said second pulsating voltage and prior to said level transition time of said first pulsating voltage in a cycle thereof.

* * * * *